United States Patent
Tsai et al.

(10) Patent No.: US 6,445,614 B1
(45) Date of Patent: Sep. 3, 2002

(54) ACCELERATED TESTING METHOD AND CIRCUIT FOR NON-VOLATILE MEMORY

(75) Inventors: Wen-Jer Tsai, Hualian; Nian-Kai Zous, Tauyuan Hsien; Ta-Hui Wang, Hsinchu, all of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/930,745

(22) Filed: Aug. 14, 2001

(30) Foreign Application Priority Data

Aug. 2, 2001 (TW) ........................... 90118848 A

(51) Int. Cl.[7] ............................. G11C 16/06; G11C 7/00
(52) U.S. Cl. ............................. 365/185.09; 365/201
(58) Field of Search ........................... 365/185.09, 201, 365/230.06, 185.13, 185.19

(56) References Cited

U.S. PATENT DOCUMENTS

| | | | | |
|---|---|---|---|---|
| 5,636,168 A | * | 6/1997 | Oyama ........................ | 365/201 |
| 5,793,675 A | * | 8/1998 | Cappelletti et al. .... | 365/185.09 |
| 5,901,080 A | * | 5/1999 | Shouno .................. | 365/185.09 |
| 6,128,219 A | * | 10/2000 | Pio et al. ............... | 365/185.09 |

\* cited by examiner

Primary Examiner—Richard Elms
Assistant Examiner—Anh Phung
(74) Attorney, Agent, or Firm—J.C. Patents

(57) ABSTRACT

An accelerated test for a non-volatile memory. A threshold voltage variation standard for assessment is selected. A set of negative gate bias voltages is applied to the gate terminals of the non-volatile memory to conduct the accelerated testing and obtain a test result. A curve relating lifetime and negative gate bias voltage is derived from the test result. According to the threshold voltage variation standard, the lifetime of the non-volatile memory is found. A word line negative gate bias voltage generator is coupled to a word line driver to apply a set of negative gate bias voltages to the gate terminals of programmed memory cells and conduct an accelerated testing.

4 Claims, 6 Drawing Sheets

ACCELERATED TESTING METHOD AND CIRCUIT FOR NON-VOLATILE MEMORY

CROSS-REFERENCE TO RELATED APPLICATION

This application claims the priority benefit of Taiwan application serial no. 90118848, filed Aug. 2, 2001.

BACKGROUND OF THE INVENTION

1. Field of Invention

The present invention relates to a testing circuit and testing method for a non-volatile memory. More particularly, the present invention relates to an accelerated testing method and circuit for a non-volatile memory having a trapping layer therein.

2. Description of Related Art

In general, each memory cell in a non-volatile memory such as a flash ROM has a gate structure that includes a control gate and a floating gate. The control gate receives a control voltage for controlling the action of the cell and the floating gate is a place for holding electric charges. Because the floating gate is normally made from conductive polysilicon material, any electrons injected into the floating gate will spread out evenly throughout the layer when the memory cell is programmed. Consequently, each memory cell having such as floating gate structure can store only a single bit. In a later version, insulating material is used to form the floating gate in the memory cell structure. Since the insulating material is able to constrain movement of electric charges, electrons can be localized resulting in the possibility of holding two bits in each cell. Ultimately, capacity of each memory cell is increased.

FIG. 1 is a schematic cross-sectional view showing a conventional non-volatile memory cell having a trapping layer that can hold two bits of data. As shown in FIG. 1, the substrate contains ion-doped regions that serve respectively as a source terminal 18 and a drain terminal 16 of the memory cell. A gate structure is formed over the substrate. The gate structure is a stack that includes an oxide layer 10, a nitride layer 12 and another oxide layer 14. The nitride layer 12 is a trapping layer for retaining electrons. Here, channel hot electron injection and band-to-band hot hole injection mechanism is utilized to program data into the memory cell or to erase data from the memory cell.

Since the trapping layer 12 is a non-conductive layer (an isolation layer), electrons induced into the trapping layer 12 are localized in regions close to the side having a drain or a source terminal nearby. In other words, when a programming voltage is applied to the gate electrode and the drain electrode while a 0V is applied to the source electrode, a strong electric field is created between the gate and the drain. Electrons are attracted into the trapping layer near the drain terminal and trapped there. Conversely, when a programming voltage is applied to the gate electrode and the source electrode while a 0V is applied to the drain terminal, a strong electric field is created between the gate and the drain. Electrons are attracted into the trapping layer near the source terminal and trapped there. Through the application of these two voltage settings, two bits of data are stored in each memory cell. In FIG. 1, locations for holding the first bit 1 and the second bit 2 are indicated.

TABLE ONE

|  |  | $V_g(V)$ | $V_s(V)$ | $V_d(V)$ | $V_b(V)$ |
|---|---|---|---|---|---|
| Program | Bit 1 | 10 | 4 | 0 | 0 |
|  | Bit 2 | 10 | 0 | 4 | 0 |
| Erase | Bit 1 | −3 | +5 | floating | 0 |
|  | Bit 2 | −3 | floating | +5 | 0 |
| Read | Bit 1 | 2.75 | 0 | 1.6 | 0 |
|  | Bit 2 | 2.75 | 1.6 | 0 | 0 |

For this type of memory cell, threshold voltage V, of the memory cell is changed by the injection of electrons into the trapping layer 12. However, the threshold voltage will drop as retention time is increased after each program/erase (P/E) cycle. The dropping of threshold voltage leads to an increase in leakage current and a loss of memory data. For example, if a voltage greater than a specific threshold voltage represents the logic state "0", actual state will be indistinguishable due to a drop in threshold voltage. In other words, stored data within the memory cell cannot be accurately read.

To ensure the long-term reliability of memory products in the hands of customers, the memory cells are tested so that even if the threshold voltage drops after a long retention period, the memory cell still manages to operate within a normal operating range without failure. Nevertheless, due to the limited testing period, a testing method for accurately determining the effective lifetime of memory cells becomes a major issue.

SUMMARY OF THE INVENTION

Accordingly, one object of the present invention is to provide an effective testing method and installation that utilizes characteristic physical properties of a non-volatile memory having an insulating trapping layer therein to determine long term reliability of the memory. The method involves an accelerated testing capable of estimating future lifetime of the memory within a short test period.

To achieve these and other advantages and in accordance with the purpose of the invention, as embodied and broadly described herein, the invention provides an accelerated testing method. A threshold voltage variation standard is chosen. A set of negative gate bias voltage is applied to the gate terminal of the non-volatile memory to conduct an accelerated test and obtain a test result. According to the test result, a curve showing the relationship between lifetime and negative gate bias voltage is obtained. Finally, according to the threshold voltage variation standard, lifetime of the non-volatile memory is determined.

This invention also provides a testing circuit for assessing the quality of memory cell array within a non-volatile memory. The memory cell array contains a plurality of memory cells arranged to form a plurality of rows and columns. Each row is coupled to a word line driver while each column is coupled to a bit line bias voltage circuit. The non-volatile memory quality testing circuit includes a word line negative gate bias voltage generator coupled to the word line driver for applying a set of negative gate bias voltages to the gate of a programmed memory cell and conducting an accelerated testing.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
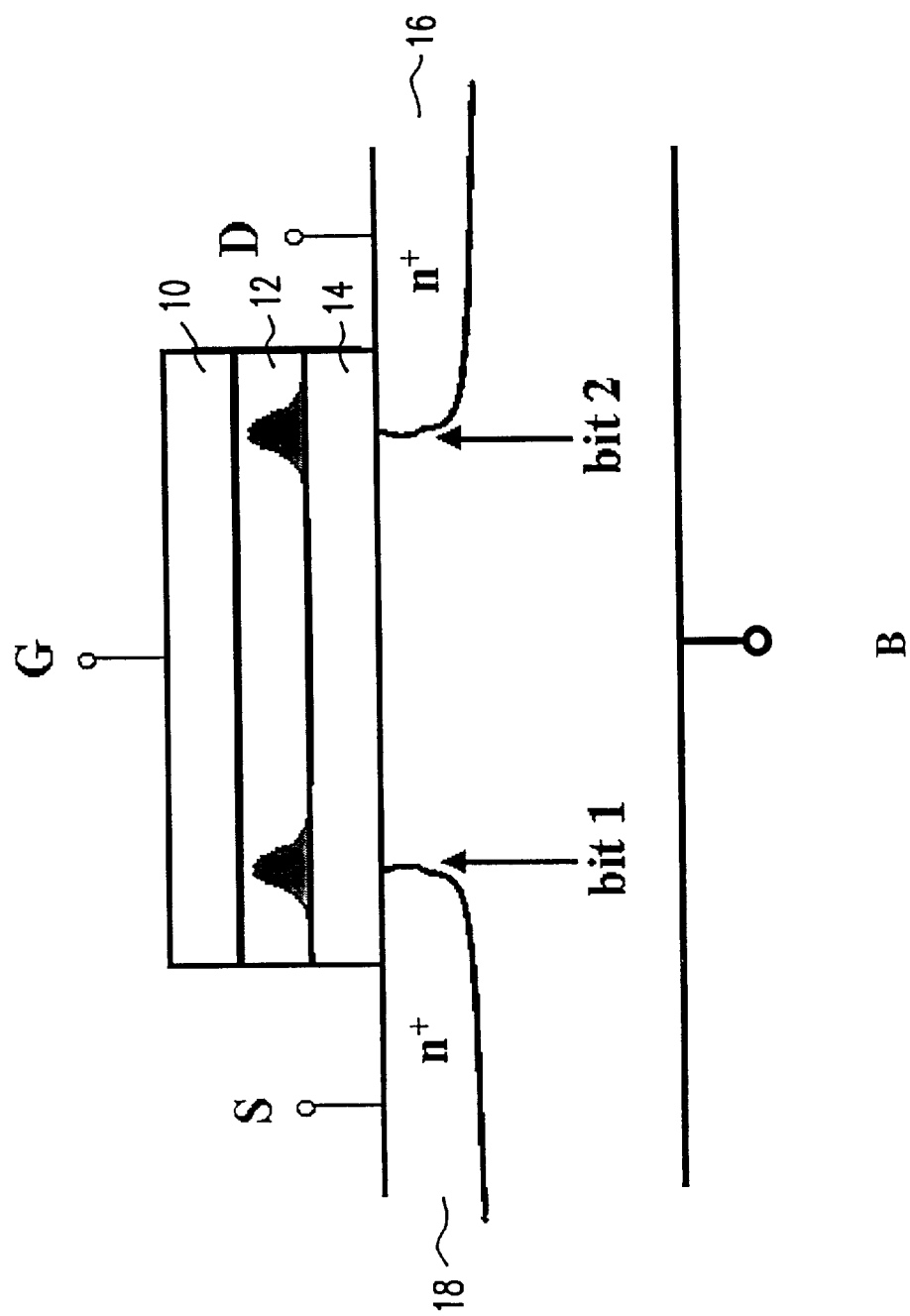
FIG. 1 is a schematic cross-sectional view showing a conventional non-volatile memory cell having a trapping layer that can hold two bits of data.

Reference will now be made in detail to the present preferred embodiments of the invention, examples of which are illustrated in the accompanying drawings. Wherever possible, the same reference numbers are used in the drawings and the description to refer to the same or like parts.

The threshold voltage of a non-volatile memory with an insulating trapping layer therein drops as retention time is increased. Such a threshold voltage drop has a dependent relationship with the negative gate bias voltage. This invention utilizes this special physical relationship to conduct an accelerated testing of the memory cells.

Figure 2:
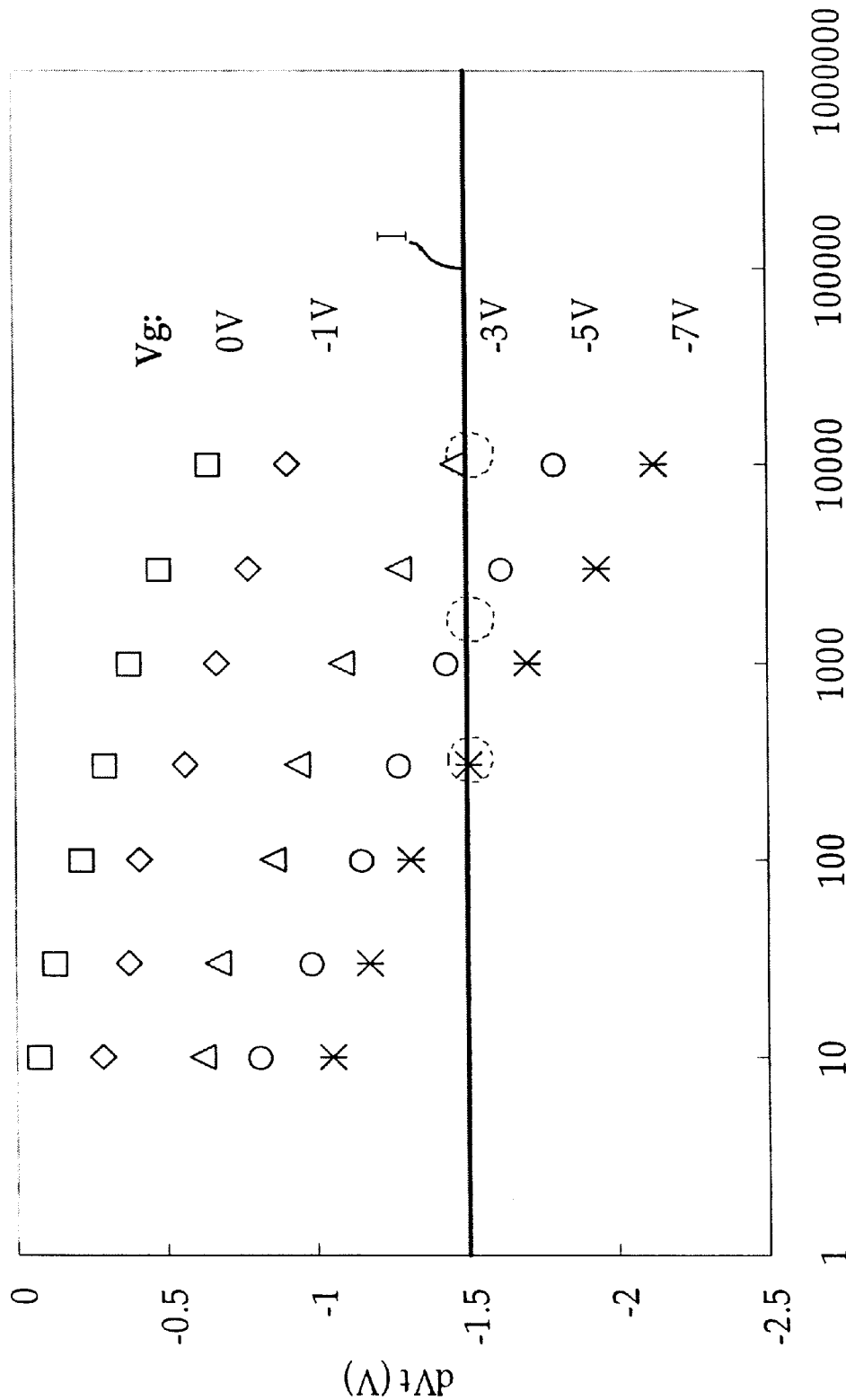
FIG. 2 is a graph showing the relationship between retention time and threshold voltage variation for different negative gate bias voltages.

FIG. 2 is a graph showing the relationship between retention time and threshold voltage variation for different negative gate bias voltages. In FIG. 2, changes in threshold voltage dVt relative to retention time with the application of different negative gate bias voltages such as Vg=0V, 1V, −3V, −5V and −7V is shown. A labeled line I represents a standard reference line for a threshold voltage variation of dVt=1.5V. A threshold voltage variation dVt exceeding the labeled line I indicates memory cell failure. For example, when Vg=0V and at a retention time of 10 seconds, corresponding threshold voltage variation dVt is about −0.1V. At a retention time of 10000 seconds, the corresponding threshold voltage variation dVt is about −0.7V. When Vg=−7V and at a retention time of 10 seconds, the corresponding threshold voltage variation dVt is about −1V. At a retention time of 10000 seconds, the corresponding threshold voltage variation dVt is about −2.2V. However, the value −2.2V exceeds the threshold voltage variation dVt provided by the standard reference line I. This indicates that the memory cell is unable to remain within the permitted threshold voltage level after 10000 seconds with Vg=−7V.

As shown in FIG. 2, the retention time is about 500 seconds when Vg=−7V, the retention time is about 2000 seconds when Vg=−5V and the retention time is about 10000 seconds when Vg=−3V. Moreover, the retention time exceeds 1000000 seconds when Vg=−1V or 0V.

According to FIG. 2, the effect of negative gate bias voltage on the threshold voltage variation dVt and retention time is self-evident. In brief, a larger negative gate bias voltage produces a larger threshold voltage variation dVt and a smaller retention time.

Figure 3:
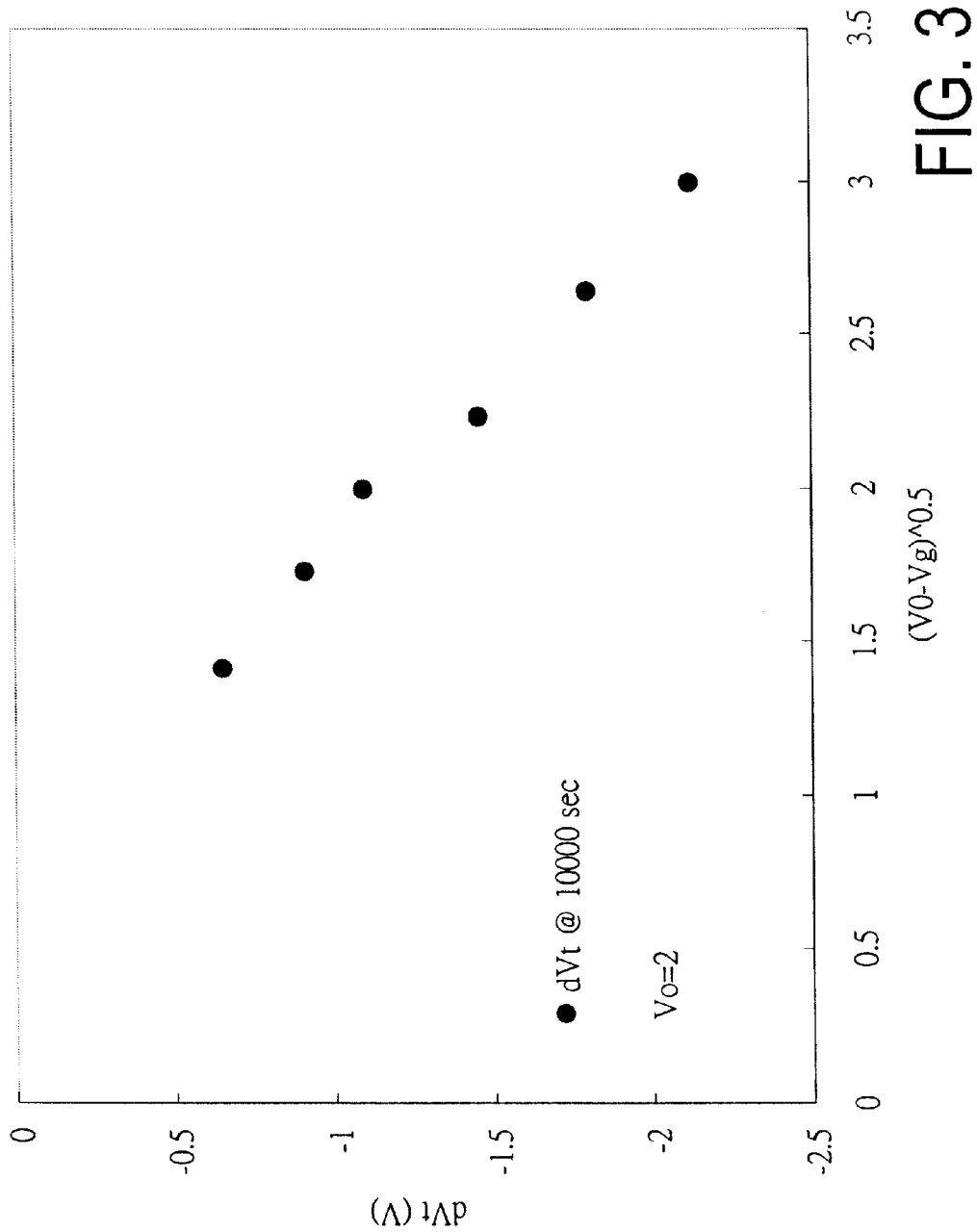
FIG. 3 is a graph showing the relationship between threshold voltage variation and negative gate bias voltage.

FIG. 3 is a graph showing the relationship between threshold voltage variation and negative gate bias voltage. The relationship can be explained using the Frenkel-Poole emission mechanism. The coordinates of the horizontal axis are determined by $(V_0-Vg)^{1/2}$, where Vg is the negative gate bias voltage and $V_0$ is a reference voltage. Within a testing period of 10000 seconds and at $V_0=2$, the curve relating the threshold voltage variation dVt and negative gate bias voltage $(V_0-Vg)^{1/2}$ is shown in FIG. 3. An almost linear relationship between the threshold voltage variation dVt and the negative gate bias voltage is quite obvious.

Figure 4:
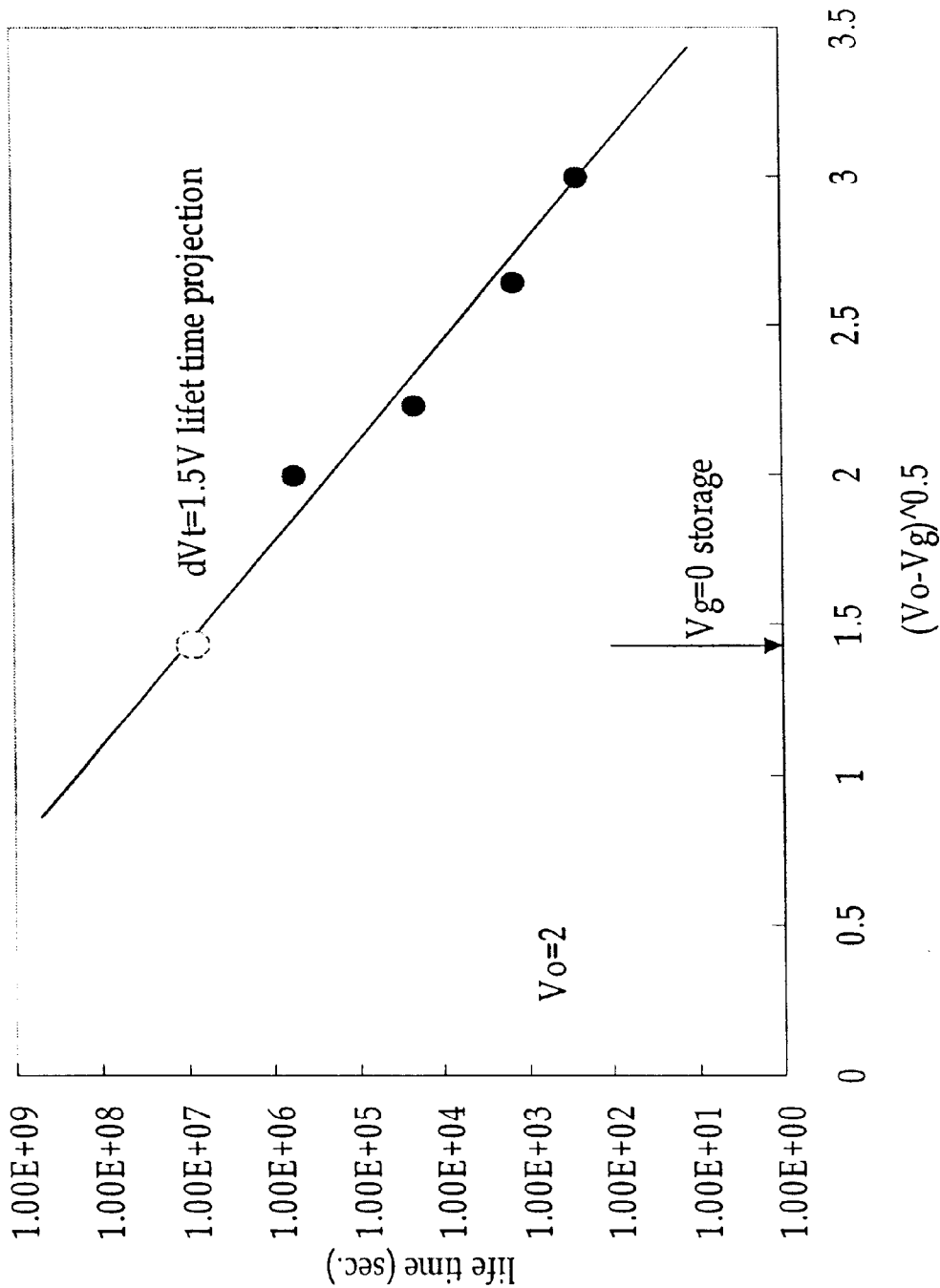
FIG. 4 is a graph showing the relationship between negative gate bias voltage and lifetime of a memory cell.

From the physical properties shown in FIGS. 2 and 3, a relationship between the negative gate bias voltage applied to the word line of a memory cell and working life of the memory cell can be derived. FIG. 4 is a graph according to FIGS. 2 and 3 showing the relationship between negative gate bias voltage $(V_0-Vg)^{1/2}$ and the lifetime of a memory cell.

As shown in FIG. 4, there is an almost linear relationship between the negative gate bias voltage $(V_0-Vg)^{1/2}$ and the lifetime of a memory cell. After selecting a voltage $V_0$, a larger negative gate bias voltage Vg results in a shorter lifetime. In this invention, such characteristic attributes are used to conduct an accelerated testing of the memory cells.

Figure 5:
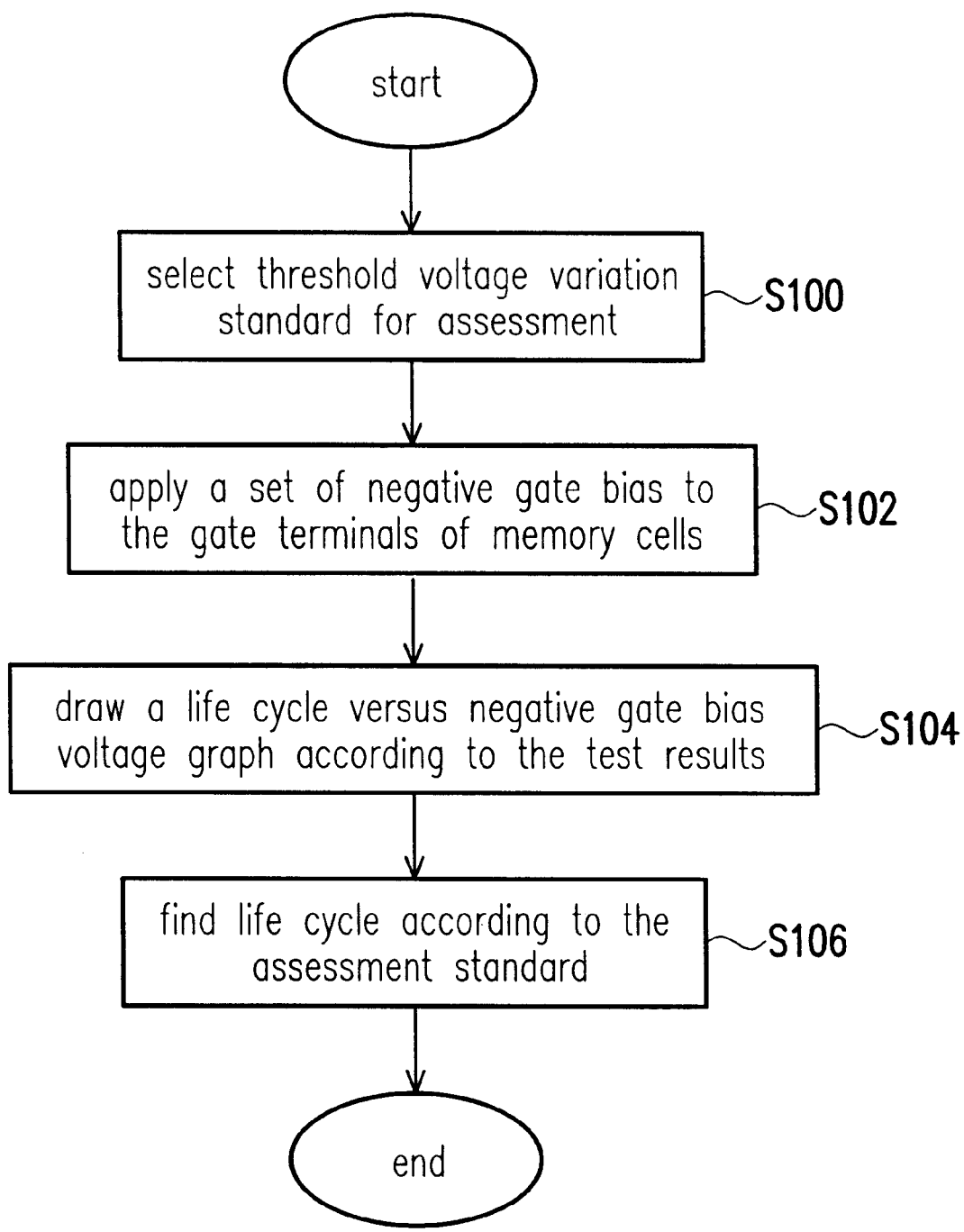
FIG. 5 is a flow chart showing an accelerated testing method for testing a non-volatile memory according to this invention.

FIG. 5 is a flow chart showing an accelerated testing method for testing a non-volatile memory according to this invention. First, in step S100, a threshold voltage variation dVt such as dVt=1.5V is selected as a judging standard. In step S102, a group of negative gate voltage is applied to the gate terminal of the memory cells to conduct a testing operation and produce a testing result.

In step S104, according to the testing result, a graph of negative gate bias voltage $(V_0-Vg)^{1/2}$ versus lifetime is constructed. For example, a linear relationship as shown in FIG. 4 is produced. The voltage $V_0$ is selected to meet the parametric requirement of a Frenkel-Poole model so that a theoretic model such as $(V_0-Vg)^{1/2}$ is also met. In step S106, lifetime when Vg=0 is found.

Figure 6:
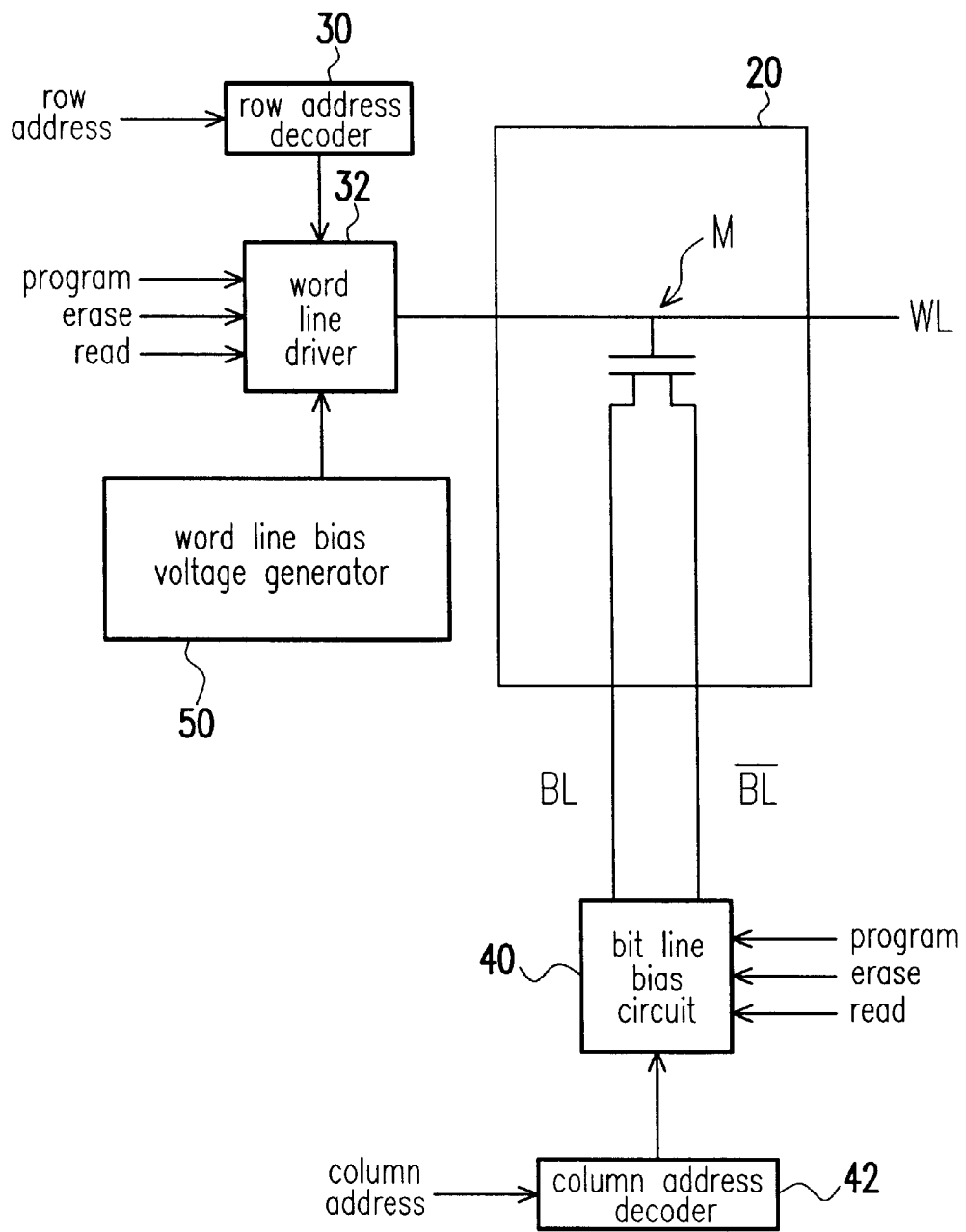
FIG. 6 is a diagram showing a circuit for assessing the quality of a non-volatile memory according to this invention.

FIG. 6 is a diagram showing a circuit for assessing the quality of a non-volatile memory according to this invention. In FIG. 6, only a memory cell M in the flash memory cell array 20 is drawn. In reality, the cell array 20 includes a plurality of memory cells arranged into a plurality of columns (with a bit line connected to the source terminals of a column of memory cells) and rows (with word lines connected to the gate terminals of a row of memory cells). A word line driver 32 is coupled to each word line (WL) for providing programming, erasing and reading voltage at the gate terminal of a memory cell. A row address decoder 30 is coupled to the word line driver 32 for receiving a row address, decoding the address and transmitting the decoded address to the word line driver 32. Thereafter, the word line driver 32 drives the memory cell connected to the selected row address (word line). A bit line bias circuit 40 is coupled to each bit line (BL) for providing programming, erasing and reading voltage at the source terminal of a memory cell. A column address decoder 42 is coupled to the bit line bias circuit 40 for receiving a column address, decoding the address and transmitting the decoded address to the bit line bias circuit 40. Thereafter, the bit line bias circuit 40 provides a bias voltage to the memory cell connected to the selected column address (bit line).

A word line negative bias generator 50 is coupled to the word line driver 32. The word line negative bias generator 50 submits a group of word line negative bias voltages to the gate terminal of memory cells for conducting an accelerated testing. For example, a graph of negative gate bias voltage $(V_0-V_g)^{1/2}$ versus lifetime, having a linear relationship, is drawn according to the testing result. According to the graph, lifetime when Vg=0 can be found.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An accelerated testing method for a non-volatile memory, comprising the steps of:

selecting a threshold voltage variation standard for assessment;

applying a set of negative gate bias voltages to the gate terminals of the non-volatile memory to conduct the accelerated testing and obtain a test result;

finding a curve relating lifetime and negative gate bias voltage according to the test result; and finding the lifetime of the non-volatile memory according to the threshold voltage variation standard.

2. The testing method of claim 1, wherein the lifetime and the negative gate bias voltage has a linear relationship.

3. A non-volatile memory quality-testing circuit for testing a memory cell array, wherein the memory cell array includes a plurality of memory cells arranged into rows and columns with each row coupled to a word line driver and each column coupled to a bit line bias circuit, the quality-testing circuit comprising:

a word line negative gate bias voltage generator coupled to the word line driver for applying a set of negative gate bias voltages to the gate terminals of programmed memory cells and conducting an accelerated testing.

4. A non-volatile memory having a quality-testing circuit therein, comprising:

a memory cell array having a plurality of memory cells arranged into a plurality of rows and columns;

a word line driving circuit coupled to various rows for driving each row;

a bit line bias circuit coupled to various columns for driving each column; and a word line negative gate bias voltage generator coupled to the word line driver for applying a set of negative gate bias voltages to the gate terminals of programmed memory cells and conducting an accelerated testing.

* * * * *